(12) United States Patent
Robin et al.

(10) Patent No.: US 10,468,436 B2
(45) Date of Patent: Nov. 5, 2019

(54) METHOD OF MANUFACTURING A LED MATRIX DISPLAY DEVICE

(71) Applicant: COMMISSARIAT A L'ENERGIE ATOMIQUE ET AUX ENERGIES ALTERNATIVES, Paris (FR)

(72) Inventors: Ivan-Christophe Robin, Grenoble (FR); Hubert Bono, Grenoble (FR); Maud Vinet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/949,566

(22) Filed: Apr. 10, 2018

(65) Prior Publication Data
US 2018/0301479 A1    Oct. 18, 2018

(30) Foreign Application Priority Data
Apr. 18, 2017   (FR) .................................. 17 53334

(51) Int. Cl.
| | |
|---|---|
| *H01L 21/265* | (2006.01) |
| *H01L 27/12* | (2006.01) |
| *H01L 33/20* | (2010.01) |
| *H01L 29/66* | (2006.01) |
| *H01L 21/324* | (2006.01) |
| *H01L 33/44* | (2010.01) |
| *H01L 21/02* | (2006.01) |

(Continued)

(52) U.S. Cl.
CPC .... *H01L 27/1262* (2013.01); *H01L 21/02675* (2013.01); *H01L 21/26513* (2013.01); *H01L 21/324* (2013.01); *H01L 27/156* (2013.01); *H01L 29/66757* (2013.01); *H01L 33/08* (2013.01); *H01L 33/20* (2013.01); *H01L 33/44* (2013.01); *H01L 25/167* (2013.01); *H01L 33/50* (2013.01); *H01L 33/60* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2015/0325598 A1 | 11/2015 | Pfeuffer et al. | |
| 2016/0268488 A1 | 9/2016 | Goeoetz et al. | |
| 2018/0294311 A1* | 10/2018 | Hsiang | ............... H01L 27/1262 |

FOREIGN PATENT DOCUMENTS

WO      WO 2016/188505 A1    12/2016

* cited by examiner

*Primary Examiner* — Chandra Chaudhari
(74) *Attorney, Agent, or Firm* — Oblon, McClelland, Maier & Neustadt, L.L.P.

(57) ABSTRACT

A method of making a display device, the method including fabricating a matrix of light-emitting diodes (LEDs), each including electrodes accessible from a back face of the matrix and light-emitting surfaces accessible from a front face of the matrix; securing, onto the back face of the matrix, a stack of layers including at least one semiconducting layer, a gate dielectric layer, and a layer of gate conducting material; and starting from the stack of layers, fabricating an electronic control circuit electrically coupled to the electrodes, including fabricating field-effect transistors (FETs) including active zones and gates, the active zones being formed in the at least one semiconducting layer, and the gates being formed in the gate dielectric layer and in the layer of gate conducting material.

14 Claims, 9 Drawing Sheets

(51) Int. Cl.
  *H01L 33/08* (2010.01)
  *H01L 27/15* (2006.01)
  *H01L 25/16* (2006.01)
  *H01L 33/50* (2010.01)
  *H01L 33/60* (2010.01)
  *H01L 33/62* (2010.01)

METHOD OF MANUFACTURING A LED MATRIX DISPLAY DEVICE

TECHNICAL DOMAIN AND PRIOR ART

The invention relates to the domain of "Light-Emitting Diode" (LED) devices, and particularly LEDs for microscreen devices with microLEDs (µLEDs).

One approach for manufacturing a high luminance microscreen is to use a matrix of LEDs made from GaN, InGaN, InGaP or even InGaAlP, each with dimensions in a plane approximately parallel to the LED emission surface equal to the order of 10 µm. Each LED is addressed individually by an electronic control circuit to which the LED matrix is coupled.

In general, the electronic control circuit includes FET (Field Effect Transistors) transistors, for example of the MOSFET type, made in an active semiconducting layer such a silicon. Such an electronic control circuit comprises for example one or two FET transistors for each LED, controlled through a matrix address.

In the case of nitride-based LEDs, the power supply voltage necessary for the transistors is of the order of 5 V. The required on-resistance for these transistors (in the conducting state) is low, usually less than about 10 kΩ for an area of the order of 1 µm². A low dispersion (of the order of less than 1%) on the voltage threshold Vt of the transistors is also required. Such performances can also be required for other types of transistors.

Transistors in the electronic control circuit are usually made in an active layer of monocrystalline silicon, to satisfy these criteria. Classical methods of making transistors include steps involving large thermal budgets that may for example reach temperatures of the order of 1000° C. However, the LED matrix cannot resist such temperatures.

In an attempt to solve this problem and avoid the LED matrix from being exposed to such temperatures, coupling can be made between a previously fabricated electronic control circuit and the LED matrix that has also been fabricated, by transferring the electronic control circuit onto the LED matrix, aligning them and hybridising them using micro-tubes.

Although this solution prevents the LED matrix from being exposed to excessive temperatures, the electronic components of the electronic control circuit associated with each pixel of the LED matrix must be aligned with the LED of this pixel with a precision of less than about 1 µm. Therefore in practice this transfer is difficult due to the very large number of connections (for example of the order of $10^6$) to be aligned and to be made at the time of this transfer between the LED matrix and the electronic control circuit. It is also very difficult to make micro-tubes with such small dimensions.

Finally, the different coefficients of thermal expansion of the materials to be hybridised is an important constraint to be managed during this hybridisation. Since this hybridisation is done for example at a temperature of more than about 100° C., the differences between the coefficients of thermal expansion of the materials accentuate the alignment offset, particularly at the periphery of these elements. There is also a thermal stress that appears during cooling that can cause breakage of the substrate assembly.

PRESENTATION OF THE INVENTION

Thus there is a need to propose a method of making a LED matrix display device that does not have the disadvantages of methods according to prior art, in other words that avoids exposure of the LED matrix to excessively high temperatures by eliminating alignment and connection problems that occur when making a transfer and hybridisation of the electronic control circuit onto the LED matrix via the micro-tubes and/or in the presence of materials with different coefficients of thermal expansion.

To achieve this, one particular embodiment discloses a method of fabricating a display device, including the implementation of at least the following steps:

fabricate a matrix of LEDs each comprising electrodes accessible from a back face of the LED matrix and light emitting surfaces on a front face of the LED matrix;

securing, or interlocking, a stack of layers comprising at least one semiconducting layer, a gate dielectric layer and a layer of gate conducting material, onto the back face of the LED matrix;

starting from the stack of layers, fabricate an electronic control circuit electrically coupled to the electrodes of the LEDs, including the fabrication of FET transistors comprising active zones and gates, the active zones being formed in the semiconducting layer and the gates being formed in the gate dielectric layer and in the layer of gate conducting material.

Since the materials used to fabricate the gates of the transistors in the electronic control circuit (in other words the gate dielectric layer and the layer of gate conducting material) are already present in the stack of layers transferred onto the LED matrix, this LED matrix is not exposed to the high temperatures encountered during depositions of these materials, for example such as formation of the gate dielectric by oxidation that involves temperatures exceeding about 700° C. or 800° C.

This method also overcomes alignment constraints since in this method that makes use of several sequentially integrated substrates (at least one first substrate for fabrication of the LED matrix and a second substrate on which the stack of layers used to fabricate the electronic control circuit is formed), the electronic control circuit is fabricated after transferring the stack of layers used to fabricate it onto the back face of the LED matrix. Thus, the alignment can easily be made at the time of lithography of the transistors and not at the time of securing the stack of layers with the LED matrix. The precision of the steps involved to position and fabricate the FET transistors on the back face of the LEDs due to the lithography used may for example be of the order of 5 nm for an advanced DUV (Deep UV) type lithography. This lithographic precision is much higher than the precision that can be achieved by a method including securing applied after the LED matrices and the control circuits have been fabricated individually (precision better than 1 µm).

This excellent alignment obtained between the LED matrix and the electronic control circuit also makes it possible to fabricate the electronic control circuit with very high transistor densities, for example at least eight transistors per LED when the electronic control circuit does not contain any capacitances, or at least four transistors for LEDs addressed by PWM ("Pulse Width Modulation").

The fact that the electronic control circuit is made after the transfer of the stack of layers on the back face of the LED matrix reduces problems related to the securing between materials that have different coefficients of thermal expansion.

Furthermore, that fact that the electrodes of the LEDs are accessible from the back face of the matrix and that the LED emission surfaces are on the front face of the matrix means that there is no need to mask the light emission of the LEDs by the electrodes.

The expression "gate dielectric layer" designates at least one layer of material configured for forming gate dielectrics of FET transistors.

The expression "layer of gate conducting material" designates at least one layer of at least one material configured for forming gate conductors of FET transistors.

According to a first variant, the gate dielectric material may be a dielectric material with high permittivity, also called a "high-k" dielectric (relative dielectric permittivity higher than that of $SiO_2$, in other words higher than 3.9), for example $HfO_2$, and the gate conducting material may be a metal.

According to a second variant, the gate dielectric material may be an oxide such as $SiO_2$ and the gate conducting material may be polysilicon.

Fabrication of the LED matrix may include implementation of the following steps for each LED:
  fabricate a mesa structure comprising at least first and second semiconducting portions with different doping and forming a p-n junction;
  fabricate a first electrode located on the mesa structure and electrically coupled to the first semiconducting portion;
  fabricate a second electrode located at the side of the mesa structure and electrically coupled to the second semiconducting portion through at least part of the lateral faces of the second semiconducting portion.

The first semiconducting portion may be the portion located on the back face of the LED matrix.

The second electrode may be electrically insulated from the first semiconducting portion by dielectric portions covering at least the lateral flanks of the first semiconducting portion. This positioning of the electrical insulation portions only on the lateral flanks of the mesa structure of each LED can improve the ratio between the active surface area of the LEDs (surface occupied by the p-n junctions) and the total surface area on which the LEDs are fabricated, thereby increasing the integration of these LEDs considering the small size of the electrical insulation portions of this structure that are strictly vertical (parallel to the lateral flanks of the mesa structures of the LEDs. Furthermore, another advantage of this high integration of electrical insulation portions is that it also minimises current densities obtained in electrodes of the LEDs, thereby reducing heating due to the Joule effect within the display device.

This structure can also give very good electrical contact between the second electrode and the p-n junctions of the LEDs, and thus optimise access resistances to this second electrode.

The expression "mesa structure" designates the fact that the LEDs are made in the form of a stack of a semiconductor with a first type of conductivity, for example the n type, and a semiconductor with a second type of conductivity opposite to the first type, for example the p type, a junction zone being present between these two semiconductors, and that this stack is etched on at least part of its height in the form of islands to make the semiconductor with the first type of conductivity accessible. These islands are called mesas.

The semiconducting layer used to fabricate the active zones of transistors in the electronic command circuit may comprise SiGe with a germanium content of between about 10% and 50%. This germanium content may advantageously be between about 30% and 40%, for example it may be equal to about 34%, which can give a good compromise between the recrystallisation rate during recrystallisation of the source and drain of the transistors and simplicity of the fabrication process. This advantageous germanium content can also reduce the maximum temperature reached during the control circuit fabrication process because the temperature at which a recrystallisation annealing is applied to the source and drain of the transistors reduces as the percentage of Ge in the channel increases.

Securing the stack of layers on the back face of the LED matrix may comprise implementation of direct bonding between a first oxide layer forming part of the stack of layers and a second oxide layer located on the back face of the LED matrix. The result obtained with such direct bonding between the stack of layers and the LED matrix is cold heterogeneous integration of the stack of transistor gates layers since it can be implemented at a temperature between ambient temperature and about 400° C., unlike methods according to prior art that required securing between the electronic control circuit and the LED matrix at higher temperatures that then causes problems due to materials with different coefficients of thermal expansion being in contact with each other.

Direct bonding between the stack of layers and the LED matrix may be done other than by oxide-oxide bonding, for example via $SiO_2$ layers planarised by chemical-mechanical polishing.

When direct oxide-oxide bonding is used, the method may also comprise fabrication of the stack of layers by implementing the following steps, before securing the stack of layers (used to fabricate the electronic control circuit) on the back face of the LED matrix:
  fabricate the gate dielectric layer on the semiconducting layer that corresponds to the surface layer of a semiconductor on insulator type substrate, for example SOI ("Silicon On Insulator");
  fabricate the layer of gate conducting material on the gate dielectric layer,
  fabricate a hard mask layer on the layer of gate conducting material;
  fabricate a mechanical support layer on the hard mask layer;
  eliminate a thick or solid layer of semiconducting material of the semiconductor on insulator type substrate;
  and in which a buried dielectric layer, or BOX ("Buried Oxide") layer of the semiconductor on insulator type substrate may form the first oxide layer that will be used for implementation of direct bonding.

The semiconducting layer of the stack of layers may comprise a crystalline semiconductor, and the active zones of the FET transistors may be formed in the semiconducting layer at least through an ion implantation in the parts of active zones of FET transistors that will form the source and drain regions of FET transistors, making the semiconductor in said parts partially amorphous, followed by a recrystallisation annealing in the solid phase of the active zones of the FET transistors.

The ion implantation in this case is implemented such that part of the thickness of the implanted active zones remains crystalline and forms a recrystallisation germ for the source and drain of the FET transistors during the recrystallisation annealing. To achieve this, the energy and the dose used during the ion implantation may be adapted such that part of the crystalline semiconductor remains in the source and drain at the end of this implantation.

The recrystallisation annealing may be implemented at a temperature between about 450° C. and 600° C.

In making the source and drain by partial amorphisation followed by a recrystallisation annealing, the electronic control circuit is obtained without implementing techniques requiring large thermal budgets.

The recrystallisation annealing may be implemented in a furnace in a conventional manner. Alternatively, the recrystallisation annealing can be implemented by exposing the source and drain of the FET transistors to a laser source, such that heat brought in by the laser source can be confined in the layers used for fabrication of this source and this drain.

Fabrication of the FET transistors may include use of the following steps:

- lithography and etching of the gate dielectric and the gate conducting material layers and the semiconducting layer such that remaining portions of the semiconducting layer form the active zones of the FET transistors;
- lithography and etching of the gate dielectric and the gate conducting material layers such that remaining portions of the gate dielectric and the gate conducting material layers form the gates of the FET transistors;
- fabricate spacers in contact with the lateral walls of the gates of the FET transistors;
- and the parts of active zones of FET transistors that will form the source and drain of FET transistors correspond to parts of the active zones of FET transistors not covered by the gates and the spacers.

Fabrication of the electronic control circuit may also comprise fabrication of electrical contacts electrically coupled to the FET transistors (particularly to the gate, source and drain contacts) and/or to the electrodes of the LEDs, after fabrication of the FET transistors. These electrical contacts may be made within one or several metallic levels formed on the back face of the LED matrix.

The method may also comprise implementation of the following steps between securing the stack of layers on the back face of the LED matrix and fabrication of the electronic control circuit:

- fabricate cavities through one face of a cap layer, each cavity being intended to face one of the LEDs;
- deposit a reflecting material at least in contact with the inner lateral walls of the cavities;
- securing said face of the cap layer in contact with the front face of the LED matrix such that each cavity is facing at least one of the LEDs;
- and the method may also comprise a step after fabrication of the electronic control circuit to thin the cap layer, eliminating bottom walls of cavities in the cap layer facing the light emitting surfaces of the LEDs.

Thus, reflecting elements are formed between the light emitting surfaces of adjacent LEDs to limit crosstalk between these LEDs.

In this case, the method uses three distinct sequentially integrated substrates to fabricate the display device.

The method may also comprise a step, after the cap layer thinning step, to fabricate phosphors between remaining portions of the cap layer, in contact with the front face of the LED matrix and facing the LED emission surfaces. Thus, the range of light wavelengths emitted by the LEDs can be adjusted and/or modified. These phosphors may be different in different LEDs.

As a variant, the method may also comprise a step between securing the stack of layers on the back face of the LED matrix and fabrication of the electronic control circuit, to fabricate an optical filter structure to filter at least part of the wavelengths that will be emitted by at least some of the LEDs on the front face of the LED matrix and facing the light emitting surfaces of said some of the LEDs.

In this case, fabrication of the optical filter structure may include at least implementation of the following steps:

- deposit a layer of a first filter material on the front face of the LED matrix;
- etch the layer of the first filter material such that remaining portions of the first filter material are facing the light emitting surfaces of some of the LEDs, called the first LEDs;
- fabricate first portions of transparent dielectric material between the remaining portions of the first filter material;
- deposit a second layer of filter material on the remaining portions of the first filter material and on the first portions of transparent dielectric material;
- etch the second layer of the filter material such that the remaining portions of the second filter material are facing the emitting surfaces of other LEDs, called second LEDs;
- fabricate second portions of transparent dielectric material between the remaining portions of the second filter material;
- and the method may also comprise a deposition of an optically transparent mechanical support layer in contact with the optical filter structure before fabrication of the electronic control circuit.

Thus, portions of filter material that modify the range of wavelengths emitted by the LEDs can be made on the front face of the LED matrix. These filter materials may be different in different LEDs. Furthermore, the number of different filter materials formed in the optical filter structure may be other than two (case of the example given above) and can more generally be greater than or equal to 1.

BRIEF DESCRIPTION OF THE DRAWINGS

This invention will be better understood after reading the description of example embodiments given purely for information and that are in no way limitative with reference to the appended drawings on which.

Figure 1A:
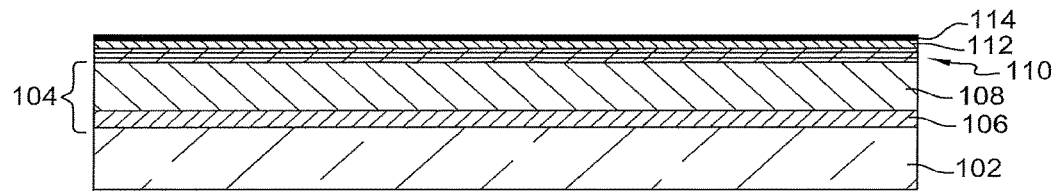
FIGS. 1A-1G represent steps implemented to fabricate a LED matrix of a display device according to one particular embodiment.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Refer firstly to FIGS. 1A to 1G that represent the steps involved to fabricate a matrix of LEDs 100 that in this case are microLEDs, for the fabrication of a display device 1000, for example of the micro-display type. This matrix of LEDs 100 will form a matrix of pixels of the display device 1000. Only one LED 100 has been shown in full in these figures.

The LEDs 100 are made from layers formed on a substrate 102, for example comprising silicon, $Al_2O_3$ or sapphire, and will be used for growth of these layers. As shown on FIG. 1A, these layers formed on the substrate 102 correspond to an n-doped semiconducting layer 104, for example GaN. This layer 104 comprises a first n type part 106 and a second n-doped part 108. As a variant, these two parts 106, 108 of the layer 104 may correspond to two different material layers, for example with the first part 106 comprising GaN and the second part 108 comprising InGaN. According to another variant, regardless of whether the two parts 106, 108 correspond to two layers of different materials or a single layer of a single material, the doping levels of the two parts 106, 108 may or may not be similar.

For example, the first part 106 of the layer 104 is a buffer layer comprising a non-intentionally doped semiconductor with the role of allowing growth on it of a semiconductor with good crystalline quality. The concentration of donors in the first part 106 may for example by of the order of $10^{17}$ donors/cm$^3$. The second part 108 of the layer 104 is, for example, a portion of intentionally doped n-type semiconductor with a concentration of donors for example between $10^{18}$ and $10^{20}$ donors/cm$^3$.

The thickness of the layer 104 may for example be between about 20 nm and 10 µm.

The layers made on the substrate 102 also comprise several layers 110 on the layer 104, that will form active emissive zones of the LEDs 100. The layers 110 correspond to one or several emissive layers each forming a quantum well, for example comprising InGaN, and each being located between two barriers for example comprising GaN. The layers 110, in other words the emissive layer(s) and the barrier layers, comprise intrinsic semiconducting materials, in other words not intentionally doped (with a concentration of residual donors $n_{nid}$ equal for example to about $10^{17}$ donors/cm$^3$, or between about $10^{15}$ and $10^{18}$ donors/cm$^3$). The thickness of the emissive layer or of each emissive layer is for example equal to about 3 nm and more generally between about 0.5 nm and 10 nm, and the thickness of each barrier layer is for example between about 1 nm and 25 nm. The number of quantum wells formed by the layers 110 is for example between about 1 and 50.

A layer of p-doped semiconducting material 112 is located on the layers 110 and, with the layers 104, will form the p-n junctions of the LEDs 100. Like the layer 104, the semiconductor of the layer 112 is for example GaN. The p doping of the layer 112 corresponds for example to a concentration of acceptors equal to between about $10^{17}$ and $10^{20}$ acceptors/cm$^3$. The thickness of the layer 112 is for example between about 20 nm and 10 µm.

An electrically conducting layer 114 is then formed on the layer 112, and will be used to form part of the contact electrodes of the p regions of the LEDs 100, in other words the anodes. The layer 114 is optically reflecting, in other words it is configured for reflecting most light (for example at least 80%) arriving on it corresponding to light emitted from active emissive zones of the LEDs 100 and that will be emitted by the LEDs 100. For example, the layer 114 comprises aluminium and/or silver, and more generally any electrically conducting and optically reflecting material, and its thickness is for example between about 50 nm and 1 µm.

Figure 1B:
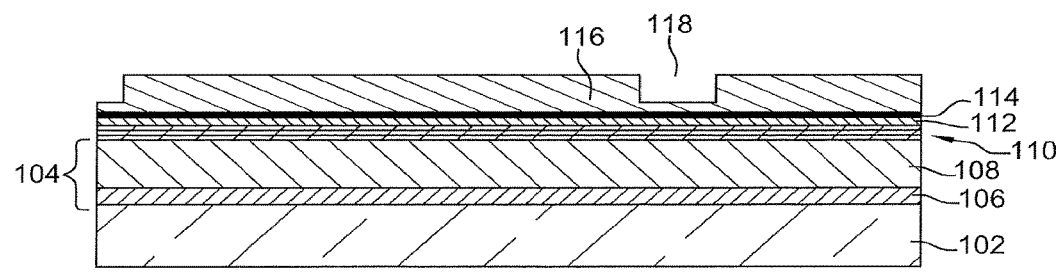

A layer 116 that will be used to fabricate a hard mask is then formed on the layer 114 (FIG. 1B). A first etching is made through a part of the thickness of the layer 116, defining locations 118 for the anodes of LEDs 100.

Figure 1C:
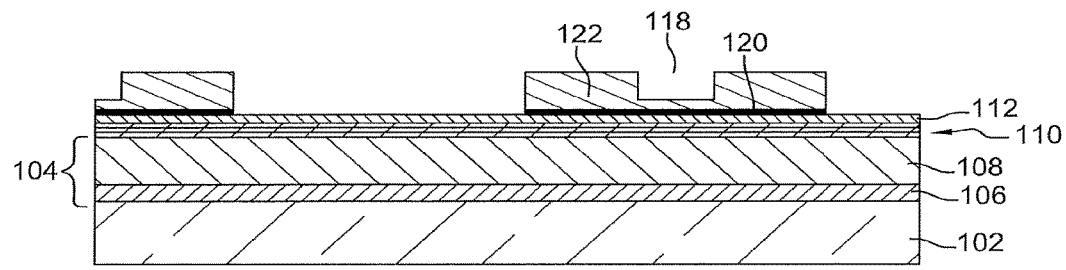

Lithography and etching are then implemented in order to structure the layer 116 to match the pattern of the required hard mask 122, so that portions 120 can then be formed by etching in the layer 114, such that each portion will form a part of the contact electrode of the p region of one of the LEDs 100 (FIG. 1C). The pattern of this etching is the pattern of a mesa structure, in other words a stack in the form of islands, that each of the LEDs will form. The section of each mesa structure of each LED 100 in a plane parallel to the face of the layer 112 on which the portions 120 are supported, may for example be disk-shaped. Therefore, each mesa structure may form a cylindrical shaped island. Each portion 120 is covered by a hard mask portion 122 in which one of the locations 118 is present. The material of the hard mask 122 (and therefore of the layer 116) is advantageously a dielectric that passivates the portions 120, for example such as $SiO_2$.

This etching according to the pattern of the hard mask 122, and therefore the pattern of the mesa structures of the LEDs 100, is then prolonged in the layers 112, 110 and part of the thickness of the layer 104, forming for each LED 100 a remaining portion of p-doped semiconductor 124, one or several active emissive zones 126 and an n-doped semiconducting portion 128. This etching is for example of the chlorine-based ICP reactive ionic etching (RIE) type. This etching is stopped at a depth in the layer 104, in other words such that a portion of this layer 104 is kept in line with each of the etched zones of the stack. When the layer 104 if formed from two parts 106 and 108, the portion of the layer 104 that is kept at each of the etched zones of the stack comprises at least one portion of the part 106. On the example in FIG. 1D, this etching is stopped at a level in the part 108 of the layer 104 such that the part 106 and a part of the thickness of the part 108 are not etched. The thickness of the etched material of the layer 104 is for example between about 200 nm and 5 µm, and depends on the initial thickness of the layer 104. As a variant, this etching may be stopped at the top face of the part 106, in other words through the entire thickness of the part 108 and such that the part 106 is not etched. According to another variant, this etching may be stopped at a level located in the part 106 such that only part of the thickness of the part 106 is not etched.

Figure 1D:
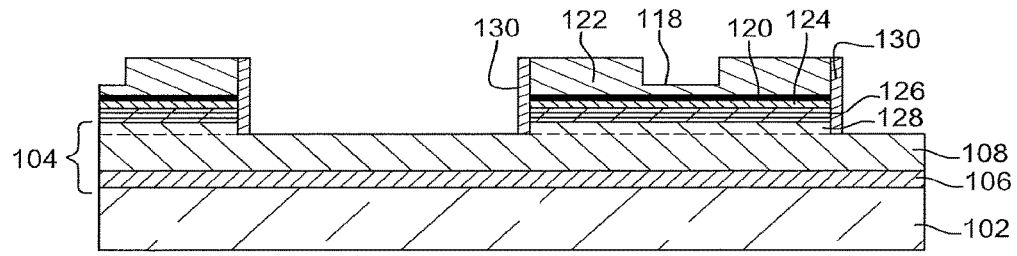

The choice of the depth of this etching depends on the choice of the height of the lateral flanks of the mesa structure that will be covered by dielectric portions 130 subsequently formed in contact with the lateral flanks of the etched parts of the layers of the stack (see FIG. 1D). Therefore in this case these dielectric portions 130 only cover the lateral flanks of the portions 122, 120, 124 and 128 and the active emissive zones 126.

The dielectric portions 130 are for example made firstly by depositing a passivation layer, typically comprising SiN, with a conforming thickness for example between about 3 nm and 100 nm, on the portions 122, along the lateral walls of the mesa structures (formed by the elements 122, 120, 124, 126 and 128), and on the unetched parts of the layer 104. Anisotropic etching, for example dry etching, is then implemented such that only the parts of this layer covering the lateral flanks of the mesa structures, are kept and form the dielectric portions 130.

Etching of the layer 104 is then prolonged through the remaining thickness of this layer, according to the pattern defined by the portions 122 and by the dielectric portions 130 and for each of the LEDs 100, forming a remaining portion 132 of the layer 104 located under the portion 128 and under the dielectric portions 130. Unlike the portion 128 for which the lateral flanks are covered by dielectric portions 130, the lateral flanks of the portion 132 are not covered by the dielectric portions 130. For example, this etching may be of the chlorine-based ICP RIE type. This etching is stopped on the front face of the substrate 102.

This etching forms spaces 134 between the mesa structures adjacent to the LEDs 100 and that are used to fabricate the cathodes of the LEDs 100. The distance between two adjacent mesa structures of LEDs 100 may for example be greater than or equal to about 50 nm. The minimum distance between two adjacent mesa structures of LEDs 100 is defined by the minimum resolution of the lithography used.

Figure 1E:
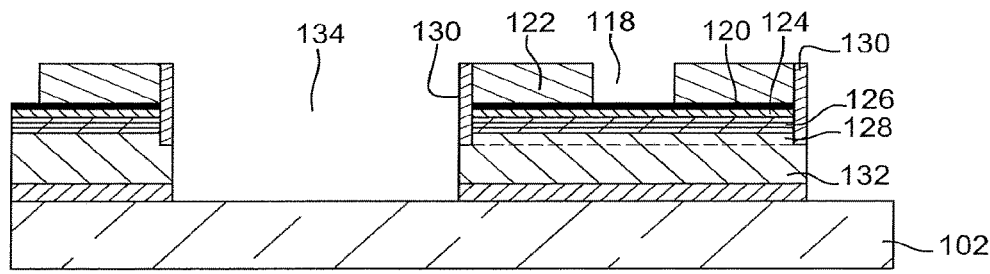
Figure 1F:
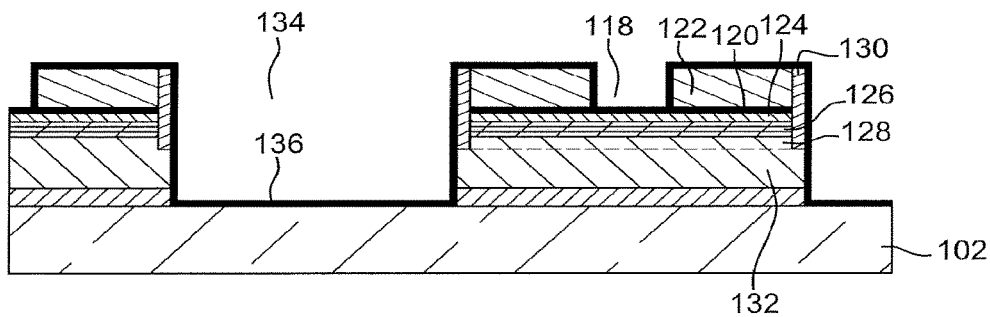
Figure 1G:
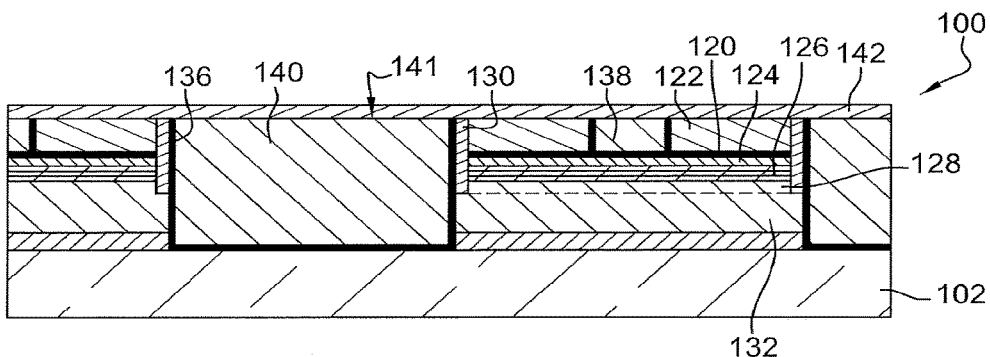

As shown on FIG. 1E, the first etching previously made through a part of the thickness of the layer 116 and defining the locations 118 is prolonged through the remaining part of the thickness of portions of the hard mask 122 such that the locations 118 form accesses to the conducting portions 120. In this case these accesses are made in two etching steps such that the lithography defining the locations 118 is made on a plane surface, so that the required resolution can be achieved. These locations 118 are intended for the fabrication of the anodes of the LEDs 100.

An electrically conducting layer 136 is then deposited in the spaces 134, on the mesa structures, in contact with the lateral flanks of these mesa structures and finally in the locations 118. In particular, this layer 136 is intended to form a contact layer for the cathodes of LEDs 100, at the lateral flanks of the portions 132. The layer 136 is preferably a stack of several materials: titanium, aluminium, and a growth layer for the subsequent deposition of the conducting material(s) of the anodes and cathodes of the LEDs 100, for example this growth layer corresponding to a Ti/TiN/Cu stack.

The LEDs 100 are made by making a deposit, for example an electrochemical deposit of a conducting material such as copper, on a thickness such that the spaces 134 are filled with this material. This material also fills the anode locations 118. Chemical-mechanical planarisation of this material is then done and the parts of the layer 136 located on the portions 122 are then applied stopping on the hard mask 122, thus forming an anode 138 and a cathode 140 for each LED 100. The anodes 138 are then electrically insulated from the cathodes 140 due to the portions of the hard mask 122 surrounding each of the anodes 138. The cathodes 140 are electrically coupled to portions 132 for which the lateral flanks are not covered by dielectric portions 130.

The LEDs 100 may be made such that they are in a common cathode configuration, in other words in which the cathodes are electrically coupled to each other. As a variant, each LED 100 may comprise a cathode 140 that is not electrically coupled to the cathodes 140 of the other LEDs 100.

A diffusion barrier, formed by the Ti layer and a TiN layer, is made on the anodes 138 and the cathodes 140 by deposition, lithography and etching.

The entire upper face of the assembly made that corresponds to a back face 141 of the matrix of LEDs 100 at which the electrodes 138 and 140 of the LEDs 100 are accessible, is covered by a bonding oxide 142 that will be used for subsequent securing of the matrix of LEDs 100 with an electronic control circuit.

In parallel to fabrication of the matrix of LEDs 100, preparation is made for the transfer of a stack of layers that will be used to fabricate components of the electronic control circuit that will be coupled to the LEDs 100, on the matrix of LEDs 100.

Figure 2A:
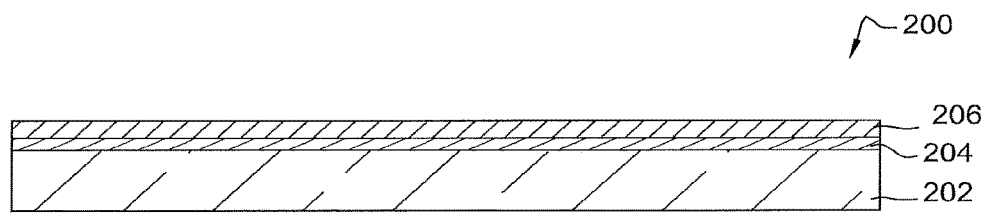
FIGS. 2A-2C represent steps implemented to fabricate a stack of layers and to transfer it onto on a LED matrix of a display device according to one particular embodiment.

This is done using a semiconductor on insulator type substrate 200 (see FIG. 2A). This substrate 200 includes a thick or solid semiconducting layer 202, for example made of silicon, on which a buried dielectric (BOX) layer 204 is arranged, for example comprising $SiO_2$. The layer 204 is covered with a surface semiconducting layer 206, in this case comprising silicon. The thickness of the layer 206 may for example be between about 5 nm and 50 nm, and advantageously more than about 30 nm to avoid the need for subsequent epitaxy that may require high temperatures or an additional technological cost.

Advantageously, the layer 206 comprises SiGe with a germanium content of between about 10% and 50%, advantageously 34%, that gives a good compromise between the recrystallisation rate by SPER (solid phase epitaxial recrystallisation that will be done later) and simplicity of the fabrication process.

The layer 206 is the active layer, in other words the layer in which the active zones of the electronic components of the electronic control circuit that will be coupled to the matrix of LEDs 100 will be made.

If the transistors of this circuit use a single-pole technology, a Vt solid-plate implantation is possible at the beginning of the production process. In this case, an ion implantation may be done on the substrate 200 followed by a full plate annealing before the gate stack described later is deposited, to adjust the threshold voltage of the transistors in the control circuit that will be made from this substrate. In particular, this can give a compromise between leaks and performances in these transistors.

A gate dielectric layer 208, in other words a layer that will form the gate dielectrics of the FET transistors of the electronic control circuit, is formed on the layer 206. This layer 208 may for example comprise oxide that can be obtained by oxidation of the layer 206, in this case with the material of the gate dielectrics that for example correspond to $SiO_2$, or by an HTO ("High Temperature Oxide") deposition. As a variant, the layer 208 may be made by deposition of a high permittivity ("high-k") dielectric material such as $HfO_2$.

Fabrication of this layer 208 is followed by deposition of a layer of gate conducting material 210 from which gate conductors of FET transistors will be formed. When the layer 208 comprises a semiconducting oxide, the material from which the layer 210 is made corresponds for example to polysilicon. As a variant, when the material of the layer 208 is a high-k dielectric, the material of layer 210 may be a stack of metals such as TiN, TaN, or TiAlN, etc., and polysilicon. The polysilicon in layer 210 may be doped.

A hard mask layer 212 is then deposited on the layer 210. For example, the material in layer 212 is a semiconductor nitride or oxide, and its thickness is for example between about 10 nm and 100 nm.

Figure 2B:
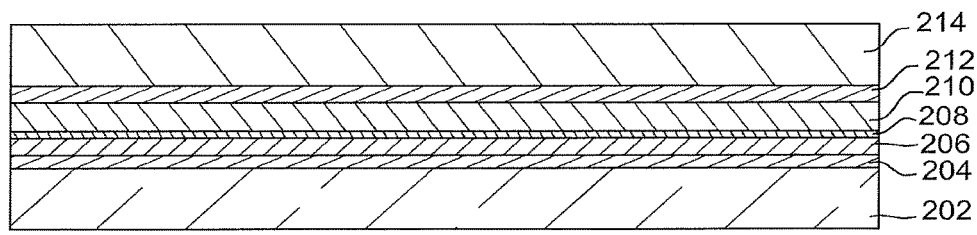

A mechanical support layer 214 is deposited on the layer 212 to form a temporary handle (FIG. 2B). This handle mechanically retains the stack of layers made, so that the thick layer 202 can be eliminated and the buried dielectric layer 204 can be accessed from the back face of this stack.

Figure 2C:
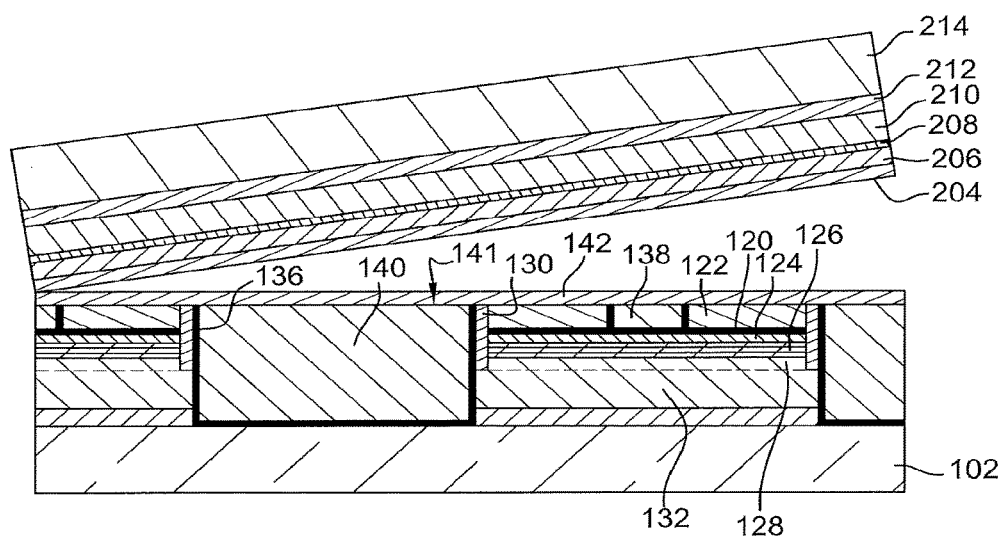

The assembly thus made is transferred to the back face 141 of the previously fabricated matrix of LEDs 100, an oxide-oxide type direct bonding being made between the buried dielectric layer 204 and the layer 142 (FIG. 2C).

After implementation of this assembly, the substrate 102 is eliminated, for example by "laser lift-off" using the layer 214 as a mechanical support layer for the assembly obtained. A front face 143 of the matrix of LEDs 100 is then accessible.

A structure that will form covers for the LEDs 100 is made in parallel with the steps described above.

Figure 3A:
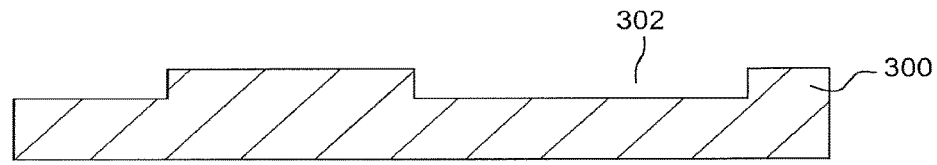
FIGS. 3A-3D represent steps implemented to fabricate a cap layer and secure it in contact with a LED matrix of a display device according to one particular embodiment.

As shown on FIG. 3A, a cover layer 300 corresponding for example to a semiconducting substrate such as silicon, is subjected to lithography and etching in part of its thickness to form cavities 302 that will be deposited facing the LEDs 100.

Figure 3B:
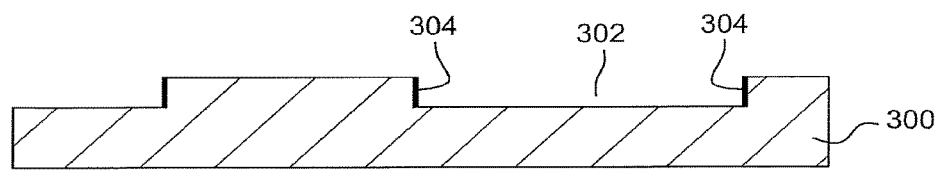

An optically reflecting material (configured for reflecting most of the light, for example more than 80% of received light) is then deposited on the face of the cover layer 300 in which the cavities 302 were made. This optically reflecting material is etched to keep only portions 304 of this optically reflecting material in contact with the lateral walls of the cavities 302 (FIG. 3B). This etching may for example be an anisotropic ICP RIE etching.

Figure 3C:
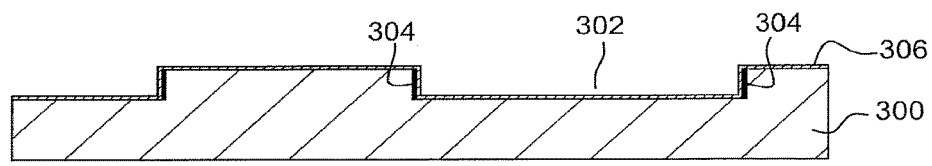

A bonding layer 306, for example comprising a semiconducting oxide such as $SiO_2$, is then formed on the assembly composed of the face of the cover layer 300 comprising the cavities 302, and in the cavities 302 (bottom wall and lateral walls formed by portions 304) (FIG. 3C).

The structure obtained that will form covers for the LEDs 100, is then secured with the front face 143 of the matrix of LEDs 100, on the side opposite at which the electrodes 138 and 140 are accessible, such that the cavities 302 are located facing the LEDs 100. The front face 143 of the matrix of LEDs 100 is previously covered with a bonding layer 144 to which the bonding layer is 306 is secured.

A consolidation annealing may be made to reinforce this bond between the matrix of LEDs 100 and the covers.

Figure 3D:
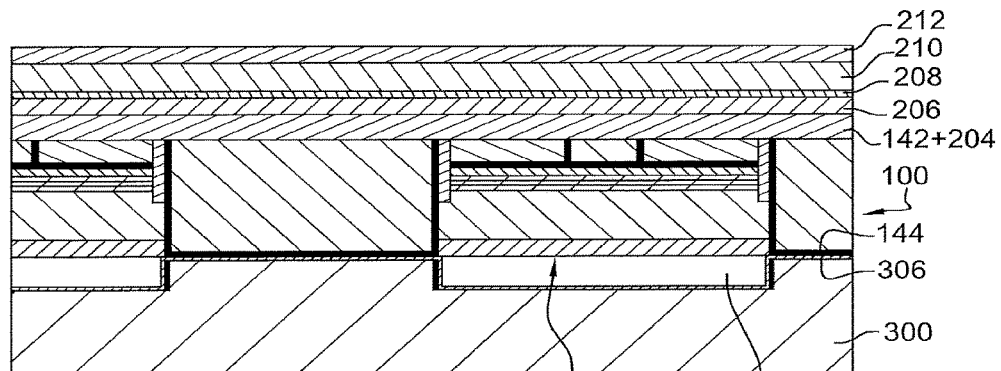

The mechanical retaining layer 214 may then be eliminated (FIG. 3D), the mechanical support for the assembly being provided by the structure of covers comprising the cover layer 300.

The layers 212, 210, 208 and 206 are then etched to define the actives zones 216 of the FET transistors that will be formed on the matrix of LEDs 100, in the layer 206. The remaining portions 218, 220 and 222 of the layers 208, 210 and 212 are etched using the same pattern as that of the active zones. This etching is stopped on the bond oxide 142+204 (FIG. 4A).

Figure 4A:
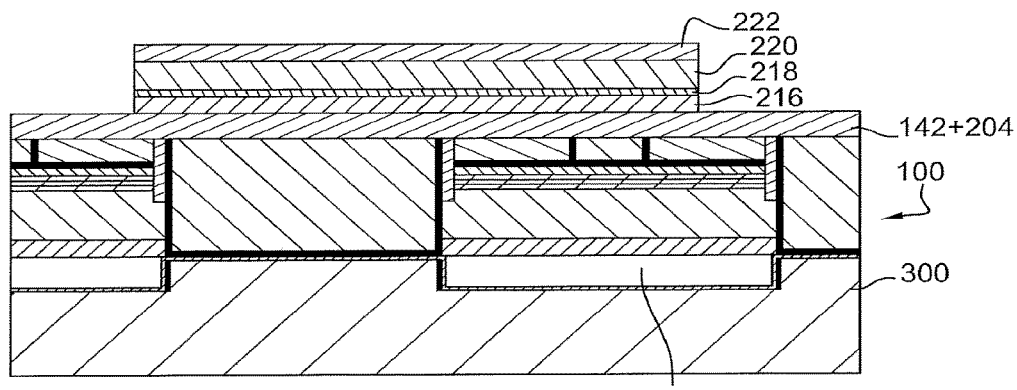
FIGS. 4A-4D represent steps implemented to fabricate the FET transistors of the electronic control circuit of a display device according to one particular embodiment.

The ratio between the dimensions of electronic components, and particularly of the FET transistors and the LEDs 100 as shown on FIG. 4A and subsequent figures is not representative of the real dimensions of these elements. Furthermore, these figures only represent the fabrication of a single FET transistor. However, for each LED 100, the electronic control circuit made may comprise several FET transistors associated with this LED 100.

Figure 4B:
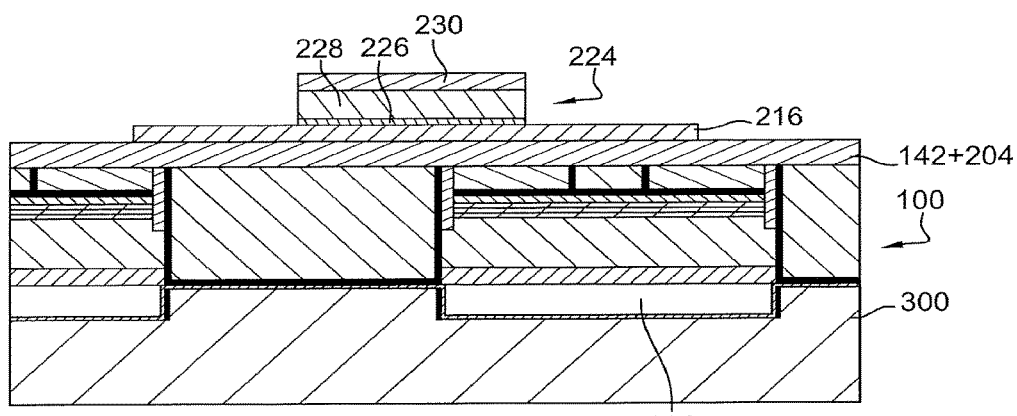
Figure 4C:
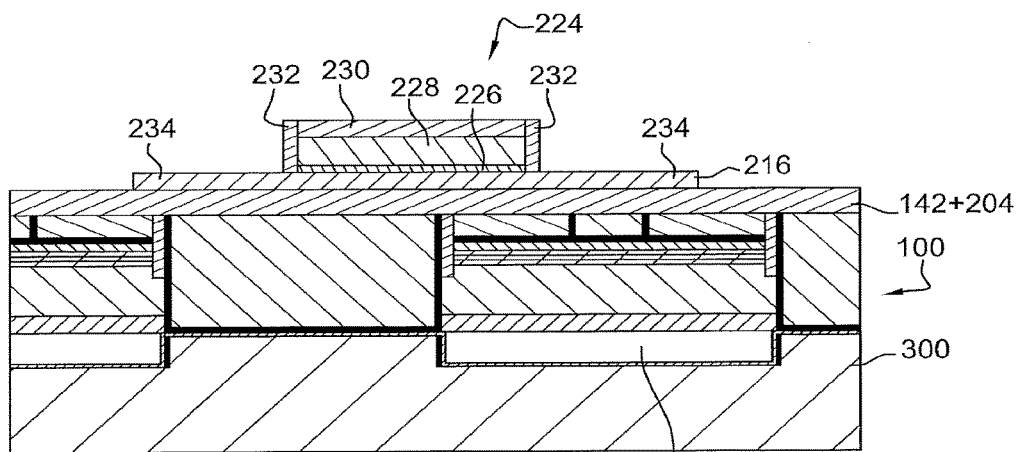

As shown on FIG. 4B, another lithography and another etching are implemented to form the gates of electronic components in the portions 218, 220 and 222. Gates 224 each comprising a gate dielectric 226 and a gate conducting portion 228 are thus made. The gates 224 are covered by a remaining portion 230 of the hard mask layer 212 used to etch the gates 224.

Spacers 232 are then made around the gates 224 and the portions 230, by deposition and etching. The spacers 232 may for example be made from one or several dielectric materials deposited at low temperature, such as SiCO, SiCBN or BN.

The source and drain regions of the transistors are then made in the parts 234 of the active zones 216 not covered by the gates 224 and by the spacers 232. These source and drain regions are made using an ion implementation designed to make the semiconductor in these parts 234 of the active zones 216 partially amorphous. This amorphisation is partial because part of the crystalline semiconductor of these parts 234 is kept, for example in the form of a recrystallisation germ with a thickness of the order of 5 nm and located at the side of the bond oxide 142+204. NMOS transistors can be fabricated by implanting Sb ions with an energy for example of between about 5 keV and 10 keV and a dose between about $5\times10^{14}$ at/cm$^2$ and $5\times10^{15}$ at/cm$^2$. PMOS transistors can be fabricated by implanting Ge ions (for example with an energy of the order of 5 keV and a dose of the order of $5\times10^{14}$ at/cm$^2$) before implanting dopants (for example boron with an energy of the order of 3 keV and a dose of $8\times10^{14}$ at/cm$^2$).

Implantation conditions may be determined for example using a Monte Carlo type particle simulator to determine the thickness of the amorphous semiconducting layer.

A solid phase recrystallisation annealing is then implemented at temperatures between about 450° C. and 600° C., forming the sources and drains 236 of the FET transistors. Advantageously, this temperature is as low as possible. This annealing may be done in a furnace or using a laser source to provide local heating for the source and drain regions.

Figure 4D:
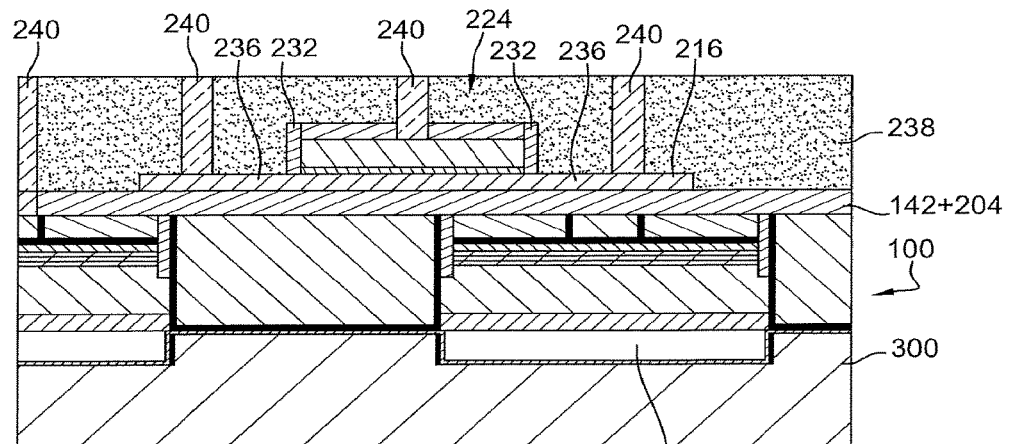

A PMD ("Pre Metal Dielectric") type dielectric layer 238, for example comprising a semiconducting oxide, is then deposited on the electronic components made and then planarised. Electrical contacts 240, particularly coupled to the previously made sources and drains 236 and to the gates 224 and the electrodes of the LEDs 100, are then made through the dielectric layer 238, and possibly the dielectric layers 142+204 for contacts coupled to the electrodes of the LEDs 100, by etching and filling with an electrically conducting material (FIG. 4D). When the thickness of the assembly formed from the dielectric layers 142+204 is greater than or equal to about 150 nm and/or if the dimensions of the transistors in the electronic control circuit are small, for example dimensions at technological nodes less than 65 nm, the electrical contacts 240 can be made in two steps: a first lithography and etching step forming the locations of the electrical contacts 240 associated with the source, drain and gate of the transistors, and a second etching step forming the locations of the electrical contacts 240 associated with the LEDs 100. These locations are then filled simultaneously to form all the electrical contacts 240.

The electronic control circuit of the matrix of LEDs 100 is made by forming one or several metallic interconnection levels above the layer 238 (not shown on FIG. 4D and subsequent figures).

Figure 4E:
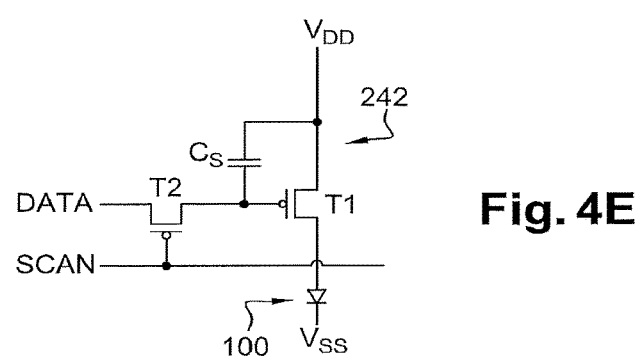
FIG. 4E represents an example embodiment of a part of an electronic control circuit of a display device according to one particular embodiment.

The electronic control circuit may be any type of electronic control circuit configured for controlling the light emission of the LEDs 100. An example of the control circuit 242 is shown on FIG. 4E. As a variant, the control circuit 242 does not comprise any capacitances, and in this case it comprises additional transistors forming memory dots.

Figure 4F:
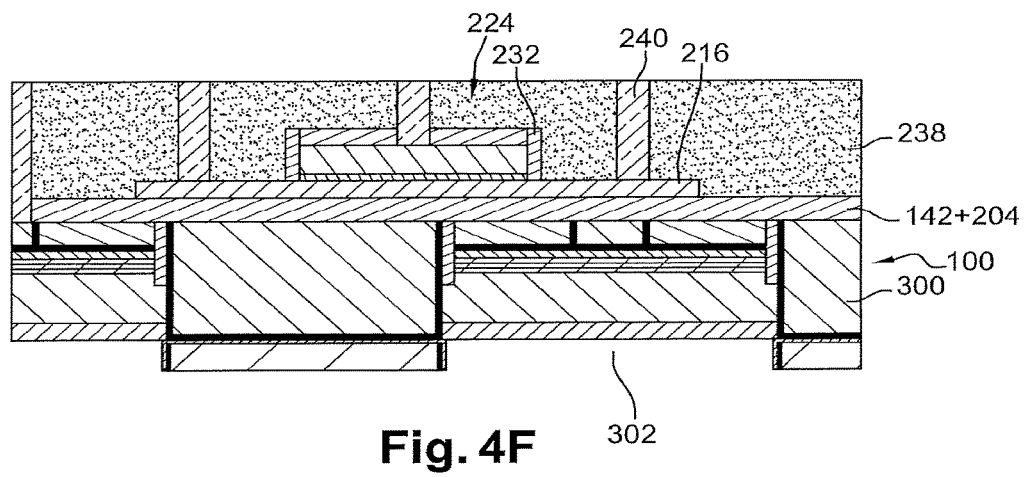
FIGS. 4F and 4G represent steps implemented for the fabrication of phosphors of a display device according to one particular embodiment.
Figure 4G:
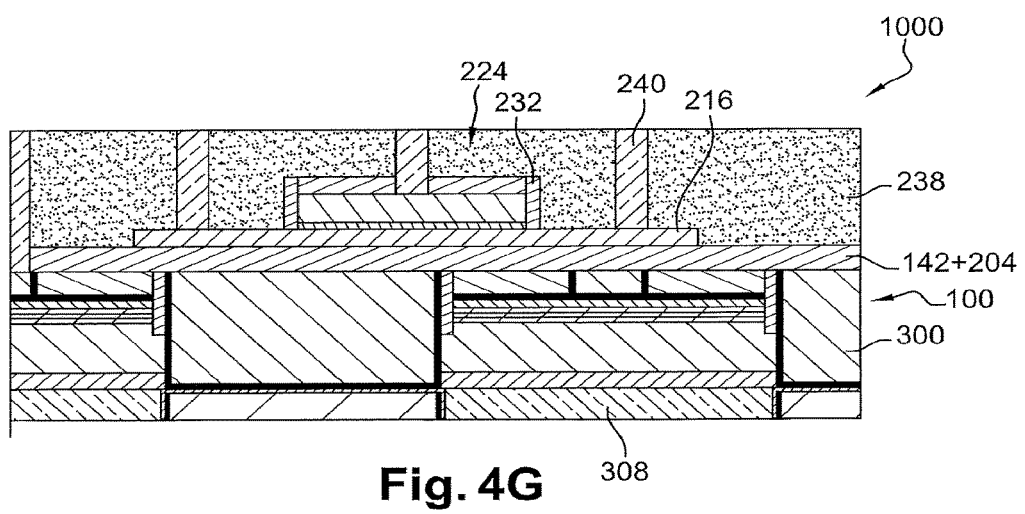

The cover layer 300 is then thinned until the cavities 302 are reached, thus opening these cavities 302 such that the LEDs 100 can emit light (FIG. 4F). Portions of the cover layer 300 are kept adjacent to the open cavities 302, so that crosstalk phenomena between adjacent pixels can be limited.

The spaces formed by the open cavities 302 can be filled with phosphors 308 located in contact with the output faces of the LEDs 100 so that wavelengths emitted by the LEDs 100 can be modified.

According to one particular example embodiment, the channels of the fabricated FET transistors can be channels (made from the layer 206) formed from SiGe with 34% of germanium, with a thickness equal to about 17 nm so that these FET transistors can be fabricated without needing to repeat an epitaxy and therefore FET transistors can be fabricated without ever exceeding a temperature of about 400° C. (temperature reached during the solid phase recrystallisation annealing, for about 47 h at 400° C. in the particular example embodiment described herein). The minimum gate length of these FET transistors may be of the order of 85 nm to provide good electrostatic control and to benefit from a gradient under the threshold of the order of 60 mV/dec. The ON current of the transistor will then be about 110 μA/μm, and its OFF current will be about $5 \times 10^{-10}$ A/μm.

As a variant, the channels of the FET transistors may be thinned so as to reduce the gate length, while benefiting from good electrostatic control over the transistor. This channel thickness may be equal to about 10 nm, which can give a gate length of the order of 50 nm (in this case with $I_{ON}$ of the order of 200 μA/μm and $I_{OFF}$ of the order of 1 nA/μm). In this case, the source and drain regions can be epitaxied at a temperature of about 450° C. Dopants can then be activated by implementing partial amorphisation as described above followed by a solid phase epitaxial recrystallisation SPER annealing at 450° C. for a duration of about 1 h10.

As a variant of the embodiment described above, the active layer 206 in which the channels of the FET transistors of the electronic control circuit are made may comprise silicon. This variant can be used to make NMOS and PMOS transistors without the fabrication constraints of NMOS transistors in SiGe. On the other hand, in this case the PMOS transistors do not have such good performances, the SPER recrystallisation rates are lower and epitaxies are resumed at temperatures equal to at least 500° C.

The thicknesses of the fabricated FET transistor channels can be less than 17 nm. In this case, the lengths of the gates may be at least 5 times the thickness of the channels, to obtain good control over short channel effects. Therefore the length of transistor gates can be adjusted depending on the required current in the transistors. It may also be necessary to epitaxy the source and drain after etching the gate and fabricating the spacers, for example when the thickness of the channel is equal to 10 nm.

FIGS. 5A to 5D represent the steps used according to another embodiment of the display device 1000. In this other embodiment, an optical filter structure 400 is made on the front face 143 of the matrix of LEDs 100.

The steps described above with reference to FIGS. 1A to 2C are implemented first.

Figure 5A:
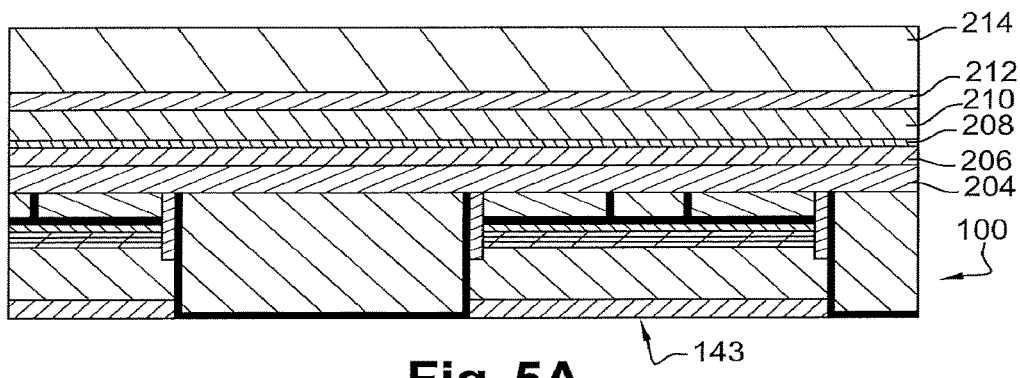
FIGS. 5A-5D represent steps implemented to fabricate an optical filter structure of a display device according to one particular embodiment.

As shown on FIG. 5A, the substrate 102 is eliminated, for example by "laser lift-off" using the layer 214 as a mechanical support layer for the assembly obtained. The front face 143 of the matrix of LEDs 100 is then accessible.

Figure 5B:
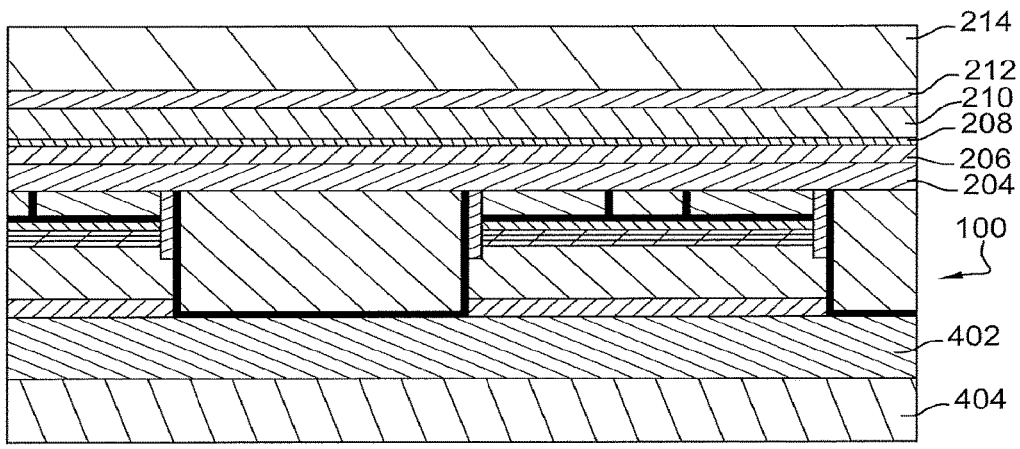

A layer 402 comprising a first filter material is formed in contact with the front face 143 of the matrix of LEDs 100. This layer 402 is supported by a growth substrate 404 used to make the layer 402 (FIG. 5B). In the example described herein, this layer 402 comprises a first filter material configured for allowing the passage of wavelengths corresponding to green, in other words between about 490 nm and 573 nm.

The growth substrate 404 is then removed and the layer 402 is then etched to keep only the remaining portions 406 of this layer 402 facing the LEDs 100, for example called first LEDs, that will emit green light.

A first transparent dielectric layer, for example comprising oxide, is then deposited and then planarised so as to fill the spaces between these portions 406. Portions 408 of transparent dielectric material are thus formed facing the LEDs 100 that will not emit green light.

Figure 5C:
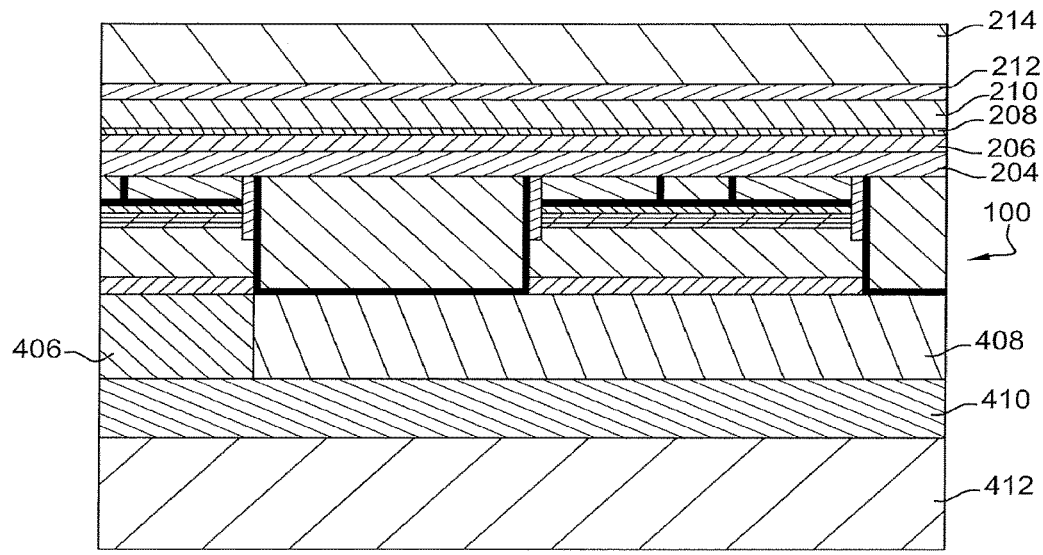

A layer 410 comprising a second filter material is formed in contact with the portions 406 and 408. Once again, this layer 410 is supported by a growth substrate 412 (FIG. 5C). In the example described herein, this layer 410 comprises a second filter material configured for allowing the passage of wavelengths corresponding to red, in other words between about 600 nm and 700 nm.

The growth substrate 412 is then removed and the layer 410 is then etched to keep only the remaining portions 414 of this layer 410 facing the LEDs 100, for example called second LEDs, that will emit red light.

A second transparent dielectric layer, for example comprising oxide, is then deposited and then planarised so as to fill the spaces between these portions 414. Portions 416 of transparent dielectric material are thus formed facing the LEDs 100 that will not emit red light.

Therefore the optical filter structure 400 according to this embodiment comprises portions 406, 408, 414 and 416. As a variant, it is possible that the optical filter structure 400 comprises only one level of portions of filter material, for example only portions 406 and 408. According to another variant, the optical filter structure 400 may comprise more than two portions of filter material, for example three. For example, the optical filter structure can be made using three different filter materials, for example allowing only wavelengths corresponding to the red, green or blue colours, the portions of these filter materials being arranged facing the LEDs 100 forming a Bayer matrix or any other filter configuration.

Figure 5D:
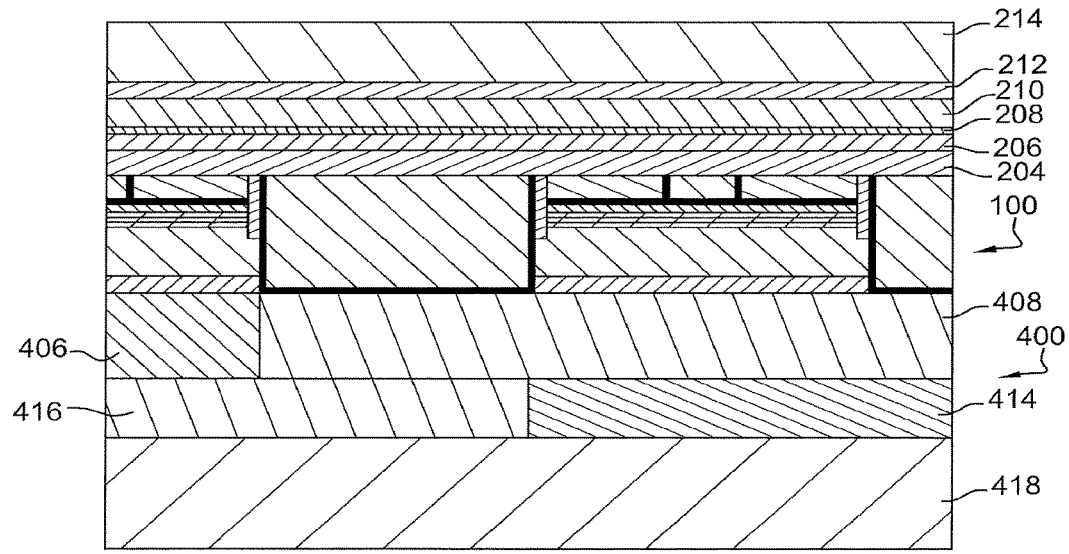

When the optical filter structure 400 is complete, an optically transparent mechanical support layer 418 is deposited on the optical filter structure 400 (FIG. 5D). This layer 418 provides mechanical support such that the layer 214 can be eliminated. This layer 418 is advantageously a glass substrate because it is fully thermally compatible with temperatures reached during implementation of subsequent steps to complete fabrication of the display device 100. Furthermore, the coefficient of thermal expansion is similar to that of silicon.

The display device 1000 is then completed by making the electronic control circuit and particularly the FET transistors, on the back face of the matrix of LEDs 100 as described above with reference to FIGS. 4A to 4D.

The invention claimed is:

1. A method of making a display device, the method comprising the following successive steps:
    fabricating a matrix of light-emitting diodes (LEDs), each comprising electrodes accessible from a back face of the matrix and light-emitting surfaces accessible from a front face of the matrix;
    securing, onto the back face of the matrix, a stack of layers comprising at least one semiconducting layer, a gate dielectric layer, and a layer of gate conducting material; and
    starting from the stack of layers, fabricating an electronic control circuit electrically coupled to the electrodes, including fabricating field-effect transistors (FETs) comprising active zones and gates, the active zones being formed in the at least one semiconducting layer, and the gates being formed in the gate dielectric layer and in the layer of gate conducting material.

2. The method according to claim 1, the fabricating the matrix of LEDs further comprises, for each of the LEDs,
fabricating a mesa structure comprising at least first and second semiconducting portions with different doping and forming a p-n junction,
fabricating a first electrode disposed on the mesa structure and electrically coupled to the first semiconducting portion, and
fabricating a second electrode disposed at a side of the mesa structure and electrically coupled to the second semiconducting portion through at least part of lateral faces of the second semiconducting portion.

3. The method according to claim 1, wherein the at least one semiconducting layer comprises SiGe with a germanium content of between about 10% and 50%.

4. The method according to claim 1, wherein the securing the stack of layers comprises implementing direct bonding between a first oxide layer, forming part of the stack of layers, and a second oxide layer disposed on the back face of the matrix.

5. The method according to claim 4, wherein the securing the stack of layers further comprises fabricating the stack of layers by implementing the following steps before the securing:
fabricating the gate dielectric layer on the at least one semiconducting layer that corresponds to a surface layer of a semiconductor-on-insulator type substrate,
fabricating the layer of gate conducting material on the gate dielectric layer,
fabricating a hard mask layer on the layer of gate conducting material,
fabricating a mechanical support layer on the hard mask layer, and
eliminating a thick layer of semiconductor of the a semiconductor-on-insulator type substrate,
wherein a buried dielectric layer of the a semiconductor-on-insulator type substrate forms the first oxide layer.

6. The method according to claim 1,
wherein the at least one semiconducting layer comprises a crystalline semiconductor, and
wherein the active zones of the FETs are formed in the at least one semiconducting layer at least through an ion implantation in parts of the active zones of the FETs that will form source and drain regions of the FETs, the ion implantation making the parts of the active zones partially amorphous, followed by a recrystallization annealing in a solid phase of the active zones of the FETs.

7. The method according to claim 6, wherein the recrystallization annealing is implemented at a temperature between about 450° C. and 600° C.

8. The method according to claim 6, wherein the recrystallization annealing is implemented by exposing the source and drain regions of the FETs to a laser source.

9. The method according to claim 6, wherein the fabricating of the FETs includes:
lithography and etching of the gate dielectric layer, of the gate conducting material layer, and of the at least one semiconducting layer, such that remaining portions of the at least one semiconducting layer form the active zones of the FETs,
lithography and etching of the gate dielectric layer and the layer of gate conducting material, such that remaining portions of the gate dielectric layer and the layer of gate conducting material form the gates of the FETs, and
fabricating spacers in contact with lateral walls of the gates of the FETs,
wherein the parts of the active zones that will form the source and drain regions of the FETs correspond to parts of the active zones not covered by the gates and the spacers.

10. The method according to claim 1, wherein, after the fabricating of the FETs, the fabricating of the electronic control circuit further comprises fabricating electrical contacts electrically coupled to the FETs and/or to the electrodes of the LEDs.

11. The method according to claim 1, further comprising, between the securing of the stack of layers and the fabricating of the electronic control circuit:
fabricating cavities through one face of a cap layer, each of the cavities configured to face one of the LEDs,
depositing a reflecting material at least in contact with inner lateral walls of the cavities,
securing the one face of the cap layer in contact with the front face of the matrix of LEDs, such that said each of the cavities is facing at least one of the LEDs, and
after the fabricating of the electronic control circuit, eliminating bottom walls of the cavities in the cap layer facing the light-emitting surfaces of the LEDs to thin the cap layer.

12. The method according to claim 11, further comprising, after the eliminating to thin the cap layer, fabricating phosphors between remaining portions of the cap layer, in contact with the front face of the matrix of LEDs and facing emission surfaces of the LEDs.

13. The method according to claim 1, further comprising, between the securing of the stack of layers and the fabricating of the electronic control circuit, fabricating an optical filter structure configured to filter at least part of wavelengths to be emitted by at least some of the LEDs on the front face of the matrix of LEDs and facing the light-emitting surfaces of said at least some of the LEDs.

14. The method according to claim 13, wherein the fabricating of the optical filter structure comprises:
depositing a first layer of filter material on the front face of the matrix of LEDs,
etching the first layer of first filter material such that remaining portions of the first layer of filter material are facing the light-emitting surfaces of a first group of the LEDs,
fabricating first portions of transparent dielectric material between the remaining portions of the first layer of filter material,
depositing a second layer of filter material on the remaining portions of the first layer of filter material and on the first portions of transparent dielectric material,
etching the second layer of filter material such that remaining portions of the second layer of filter material are facing the light-emitting surfaces of a second group of LEDs,
fabricating second portions of transparent dielectric material between the remaining portions of the second layer of filter material, and
depositing, before the fabricating of the electronic control circuit, an optically transparent mechanical support layer in contact with the optical filter structure.

* * * * *